(12) United States Patent
Rao et al.

(10) Patent No.: US 6,898,470 B1
(45) Date of Patent: May 24, 2005

(54) DIGITAL TONE CONTROLS AND SYSTEMS USING THE SAME

(75) Inventors: Raghunath Rao, Austin, TX (US);
Narsimham Gangishetti, Austin, TX (US); Miroslav Dokic, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 862 days.

(21) Appl. No.: 09/707,875

(22) Filed: Nov. 7, 2000

(51) Int. Cl.[7] .............................. G06F 17/00; H03G 5/00
(52) U.S. Cl. ............................................ 700/94; 381/98
(58) Field of Search .............................. 700/94; 381/98, 381/99, 100, 101, 103

(56) References Cited

U.S. PATENT DOCUMENTS

| | | | |
|---|---|---|---|
| 4,803,647 A | * | 2/1989 | Dieterich .................... 708/320 |
| 5,892,833 A | * | 4/1999 | Maag et al. ................... 381/98 |
| 5,910,904 A | * | 6/1999 | Uramoto ....................... 381/98 |
| 6,222,110 B1 | * | 4/2001 | Curtis et al. .................. 84/736 |

OTHER PUBLICATIONS

"Sound Reinforcement Handbook" Written for Yamaha by Gary Davis & Ralph Jones, Section 5 1987, Rev 4, pp. 9.

* cited by examiner

*Primary Examiner*—Stella Woo
(74) *Attorney, Agent, or Firm*—Thompson & Knight LLP; James J. Murphy

(57) ABSTRACT

Digital tone controls 500 include a first path 502 including a digital filter 504 and a scaler 505 for controlling a level of a low frequency component of a received digital audio signal. A second 502 includes a digital filter 504 and a scaler 505 for controlling a level of a high frequency component of the received digital audio signal. A third path 503 includes a scaler 506 for controlling a level of an unfiltered component of the received audio signal. A summer 507 adds a contribution from each of the paths to generate a composite signal having a selected gain-frequency response.

29 Claims, 10 Drawing Sheets

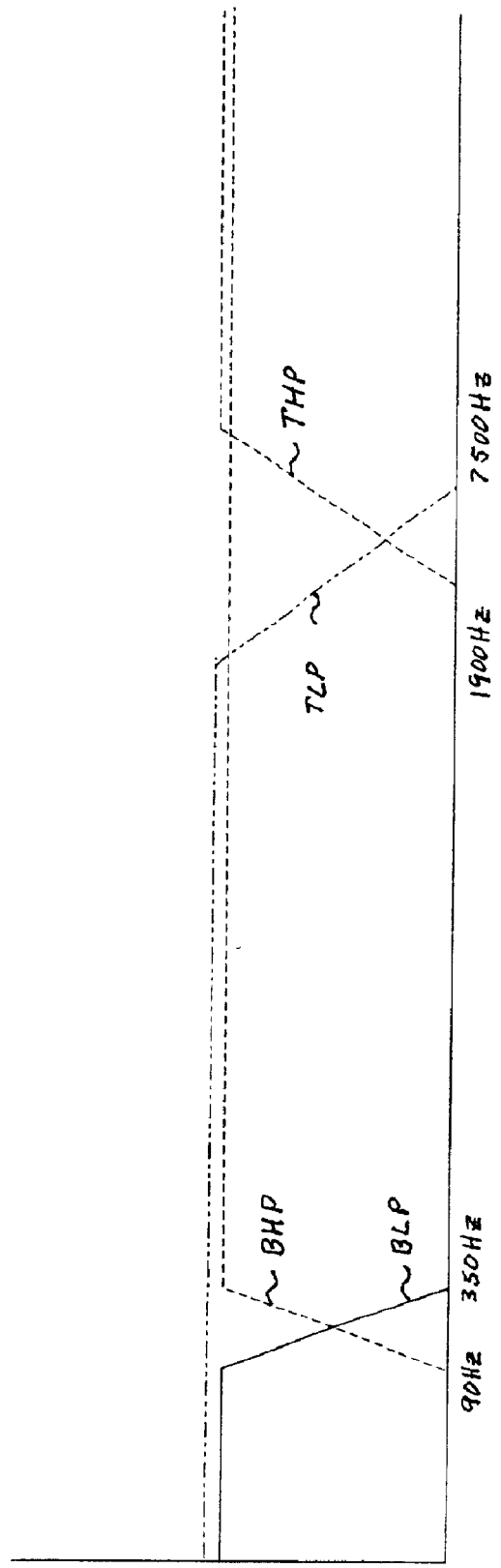

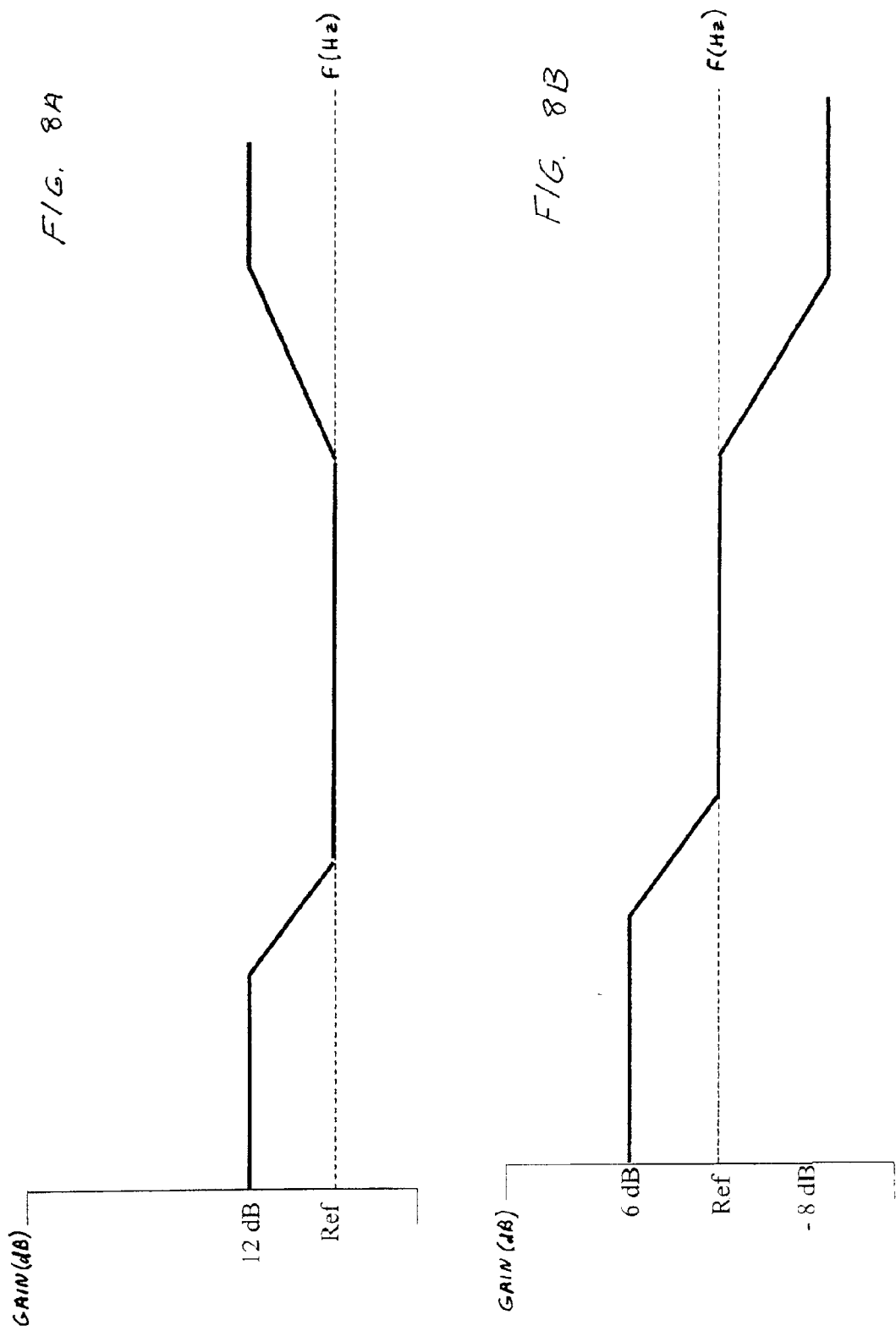

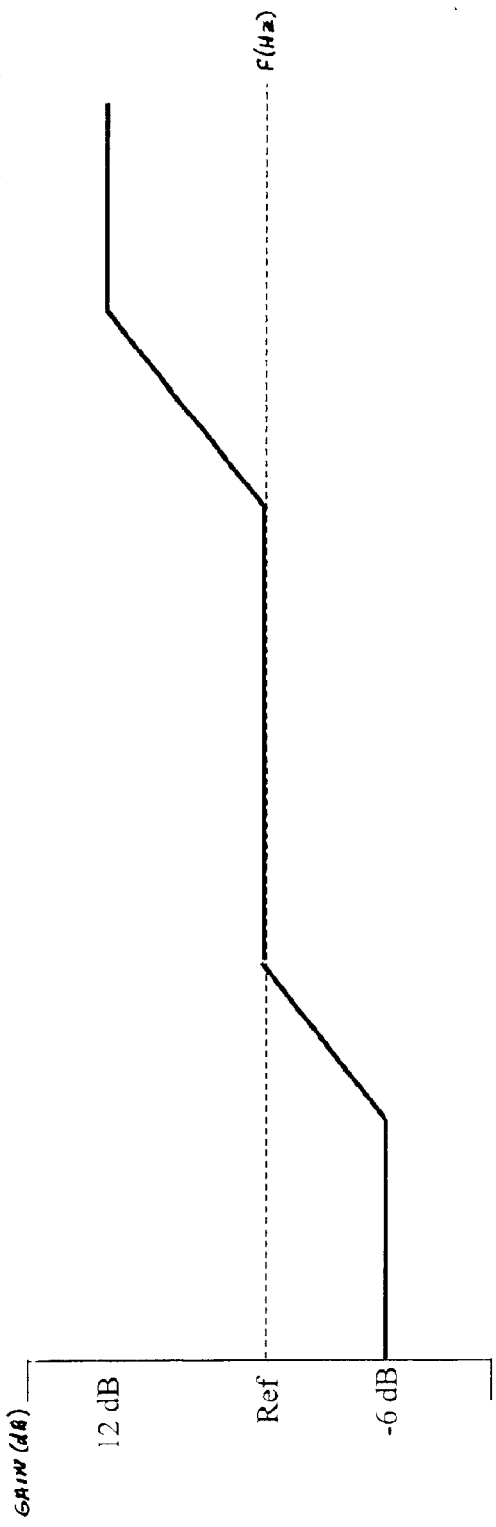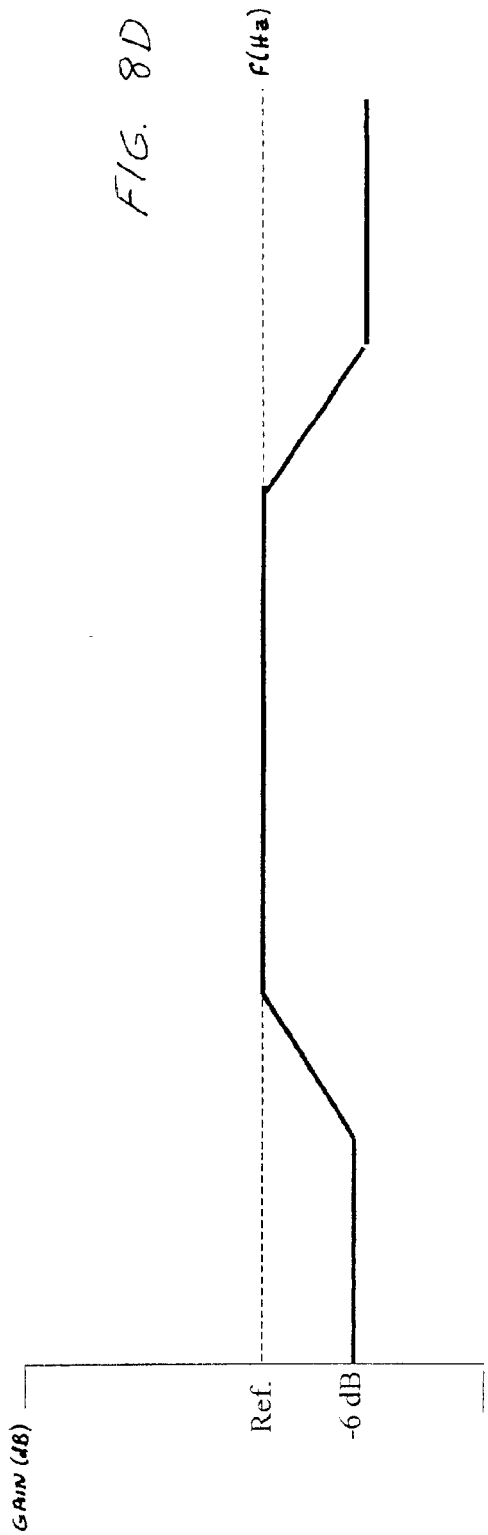

DIGITAL TONE CONTROLS AND SYSTEMS USING THE SAME

BACKGROUND OF THE INVENTION

1. Field of the Invention

The present invention relates in general to digital signal processing and in particular, to digital tone controls and systems using the same.

2. Description of the Related Art

Most audio equipment includes tone controls allowing adjustment of the audible treble and bass responses as a matter of listener taste. In low-cost applications, such as inexpensive portable consumer audio appliances, where precise tone adjustment is not a critical requirement, minimal tone controls can be implemented with simple analog circuits and a small number of buttons, dials or knobs. In higher-end consumer appliances and professional audio equipment, the size, complexity and cost of the tone controls increase in proportion to such factors as the number of frequency bands over which precise control is desired and the number of steps of attenuation needed in each frequency band.

With the maturing of several digital audio technologies such as Compact Disks (CDs), Digital Video Disks (DVDs) and MPEG Layer 3 audio, the prevailing trend has been to perform more of the audio processing functions in the digital domain. Among other things, it would be clearly be desirable to implement the tone control functions in the digital domain. This would eliminate the need for specific analog circuits, such as resistor-capacitor OP-AMP filters, allow the tone controls to be implemented in either hardware or software, and support direct control by the system digital processors or controllers. Notwithstanding, the problem of implementing digital tone controls is not trivial.

One possible means of implementing digital tone controls would be to set up a cascade bank of digital filters, either in hardware or software, each for setting the gain (attenuation) of selected frequency band of the incoming signal. To change the gain of a given frequency component, the filter coefficients of the corresponding filter would then be appropriately adjusted to boost or cut the level of that component relative to the other frequency components. However, changing filter coefficients on the fly can result in the filter traversing regions of instability, depending on the configuration of the feedback loops and mismatch between the changing coefficients and the initial conditions. As a result, "clicks", "pops", "zipper noise" due to rapid change and similar discontinuities and artifacts can occur in the audible output of filter coefficients corresponding to user adjustment of controls.

In sum, new hardware, software and methods are required for implementing digital tone controls. These implementations should be applicable to digital signal processor-based systems, as well as discrete digital audio processing circuits and systems.

SUMMARY OF THE INVENTION

In accordance with one embodiment of the principles of the present invention, digital tone controls are disclosed which include a first path having a digital filter and a scaler for controlling a level of a low frequency component of a received digital audio signal. A second path includes a digital filter and a scaler for controlling a level of a high frequency component of the received digital audio signal, while a third path includes a scaler for controlling a level of an unfiltered component of the received audio signal. A summer adds a contribution from each of the paths to generate a composite signal having a selected gain-frequency response.

The principles of the present invention provide substantial advantages over the prior art. Among other things, the filter coefficients for the tone controls are set up at system initialization and then maintained during normal system operation, even as the user changes the desired audible response. As a result, clicks, pops, zipper noise, and similar artifacts in the audible output are minimized. Additionally, several different types of digital filters can be used to implement the inventive principles, including first order IIR filters which require minimum of hardware and/or software to construct. Moreover, the scaling stages can easily be constructed from multiplier stages in either hardware or software. Finally, the number of tone control paths per channel can be increased or decreased depending on the desired frequency resolution without significant changes to the system hardware and/or software.

BRIEF DESCRIPTION OF THE DRAWINGS

For a more complete understanding of the present invention, and the advantages thereof, reference is now made to the following descriptions taken in conjunction with the accompanying drawings, in which:

FIG. 7A is a gain versus frequency chart illustrating an exemplary set of responses of the IIR filters;

FIGS. 8A–D are exemplary frequency response curves illustrating exemplary boost and cut selections by the user.

DESCRIPTION OF THE PREFERRED EMBODIMENTS

The principles of the present invention and their advantages are best understood by referring to the illustrated embodiment depicted in FIGS. 1–4 of the drawings, in which like numbers designate like parts.

Figure 1A:
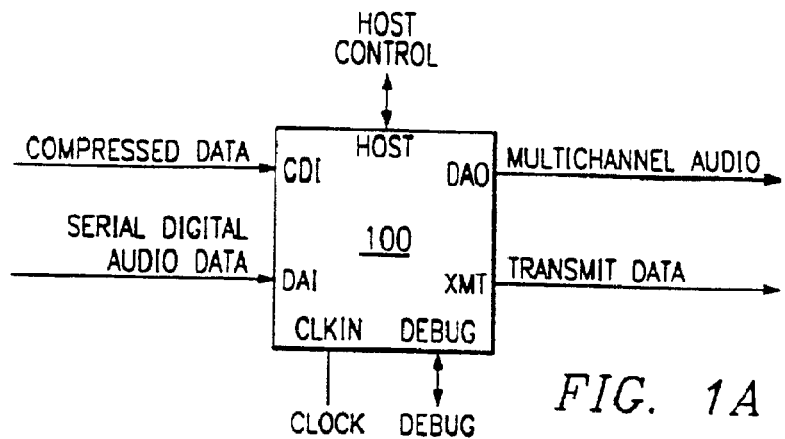
FIG. 1A is a diagram of a multichannel audio decoder embodying the principles of the present invention.

FIG. 1A is a general overview of an audio information decoder 100 embodying the principles of the present invention. Decoder 100 is operable to receive data in any one of a number of formats, including compressed data in conforming to the AC-3 digital audio compression standard, (as defined by the United States Advanced Television System. Committee) through a compressed data input port CDI. An independent digital audio data (DAI) port provides for the input of PCM, S/PDIF, or non-compressed digital audio data.

A digital audio output (DAO) port provides for the output of multiple-channel decompressed digital audio data. Independently, decoder 100 can transmit data in the S/PDIF (Sony-Phillips Digital Interface) format through transmit port XMT.

Decoder 100 operates under the control of a host microprocessor through a host port HOST and supports debugging by an external debugging system through the debug port DEBUG. The CLK port supports the input of a master clock for generation of the timing signals within decoder 100.

While decoder 100 can be used to decompress other types of compressed digital data, it is particularly advantageous to use decoder 100 for decompression of AC-3 Bitstreams.

Therefore, for understanding the utility and advantages of decoder 100, consider the case of when the compressed data received at the compressed data input (CDI) port has been compressed in accordance with the AC-3 standard.

Generally, AC-3 data is compressed using an algorithm which achieves high coding gain (i.e., the ratio of the input bit rate to the output bit rate) by coarsely quantizing a frequency domain representation of the audio signal. To do so, an input sequence of audio PCM time samples is transformed to the frequency domain as a sequence of blocks of frequency co-efficients. Generally, these overlapping blocks, each composed of 512 time samples, are multiplied by a time window and transformed into the frequency domain. Because the blocks of time samples overlap, each PCM input sample is represented by two sequential blocks factor transformated into the frequency domain. The frequency domain representation may then be decimated by a factor of two such that each block contains 256 frequency coefficients, with each frequency coefficient represented in binary exponential notation as an exponent and a mantissa.

Next, the exponents are encoded into coarse representation of the signal spectrum (spectral envelope), which is in turn used in a bit allocation routine that determines the number of bits required to encoding each mantissa. The spectral envelope and the coarsely quantized mantissas for six audio blocks (1536 audio samples) are formatted into an AC-3 frame. An AC bit stream is a sequence of the AC-3 frames.

In addition to the transformed data, the AC-3 bit stream also includes additional information. For instance, each frame may include a frame header which indicates the bit rate, sample rate, number of encoded samples, and similar information necessary to subsequently synchronize and decode the AC-3 bit stream. Error detection codes may also inserted such that the device such as decoder 100 can verify that each received frame of AC-3 data does not contain any errors. A number of additional operations may be performed on the bit stream before transmission to the decoder. For a more complete definition of AC-3 compression, reference is now made to the digital audio compression standard (AC-3) available from the advanced televisions systems committee, incorporated herein by reference.

In order to decompress under the AC-3 standard, decoder 100 essentially must perform the inverse of the above described process. Among other things, decoder 100 synchronizes to the received AC-3 bit stream, checks for errors and deformats the received AC-3 data audio. In particular, decoder 100 decodes spectral envelope and the quantitized mantissas. A bit allocation routine is used to unpack and de-quantitize the mantissas. The spectral envelope is encoded to produce the exponents, then, a reverse transformation is performed to transform the exponents and mantissas to decoded PCM samples in the time domain. Subsequently, post processing of the PCM audio can be performed using various algorithms including digital tone control. The final PCM is converted to an analog signal via a DAC and then processed by a typical analog signal chain to speakers.

Figure 1B:
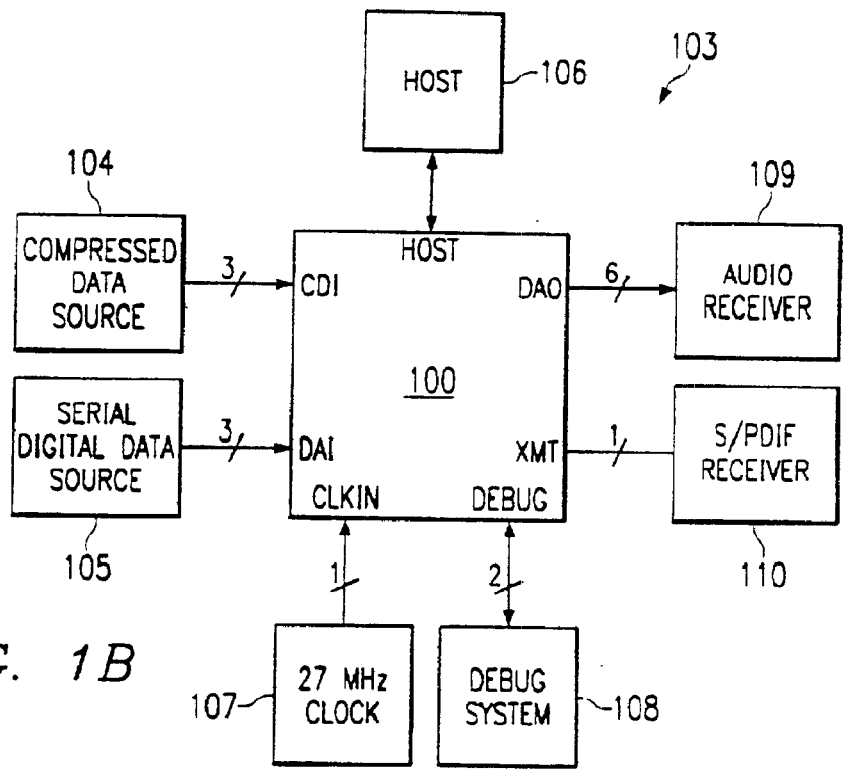
FIG. 1B is a diagram showing the decoder of FIG. 1 in an exemplary system context.

FIG. 1B shows decoder 100 embodied in a representative system 103. Decoder 100 as shown includes three compressed data input (CDI) pins for receiving compressed data from a compressed audio data source 104 and an additional three digital audio input (DAI) pins for receiving serial digital audio data from a digital audio source 105. Examples of compressed serial digital audio source 105, and in particular of AC-3 compressed digital sources, are digital video discs and laser disc players.

Host port (HOST) allows coupling to a host processor 106, which is generally a microcontroller or microprocessor that maintains control over the audio system 103. For instance, in one embodiment, host processor 106 is the microprocessor in a personal computer (PC) and System 103 is a PC-based sound system. In another embodiment, host processor 106 is a microcontroller in an audio receiver or controller unit and system 103 is a non-PC-based entertainment system such as conventional home entertainment systems produced by Sony, Pioneer, and others. A master clock, shown here, is generated externally by clock source 107. The debug port (DEBUG) consists of two lines for connection with an external debugger, which is typically a PC-based device.

Decoder 100 has six output lines for outputting multichannel audio digital data (DAO) to digital audio receiver 109 in any one of a number of formats including 3-lines out, 2/2/2, 4/2/0, 4/0/2 and 6/0/0. A transmit port (XMT) allows for the transmission of S/PDIF data to an S/PDIF receiver 110. These outputs may be coupled, for example, to digital to analog converters or codecs for transmission to analog receiver circuitry.

Figure 1C:
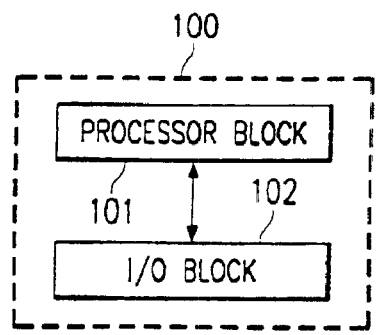
FIG. 1C is a diagram showing the partitioning of the decoder into a processor block and an input/output (I/O) block.

FIG. 1C is a high level functional block diagram of a multichannel audio decoder 100 embodying the principles of the present invention. Decoder 100 is divided into two major sections, a Processor Block 101 and the I/O Block 102. Processor Block 106 includes two digital signal processor (DSP) cores, DSP memory, and system reset control. I/O Block 102 includes interprocessor communication registers, peripheral I/O units with their necessary support logic, and interrupt controls. Blocks 101 and 102 communicate via interconnection with the I/O buses of the respective DSP cores. For instance, I/O Block 102 can generate interrupt requests and flag information for communication with Processor Block 101. All peripheral control and status registers are mapped to the DSP I/O buses for configuration by the DSPs.

Figure 2:
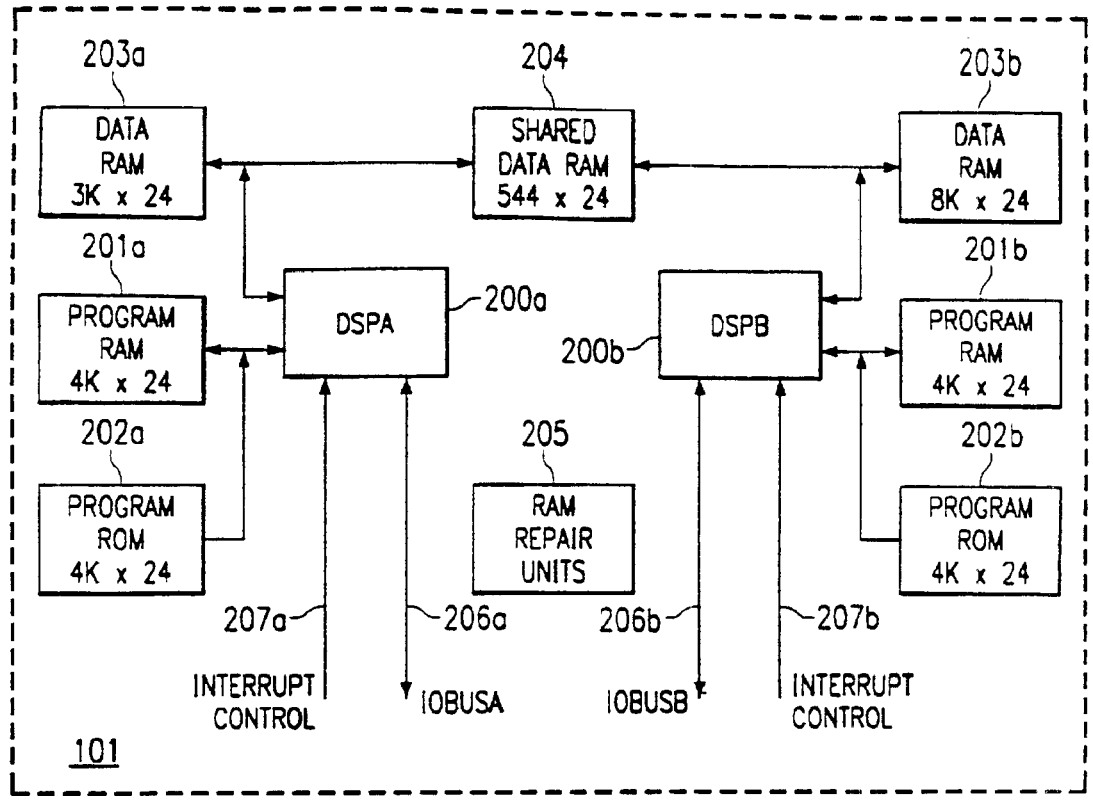
FIG. 2 is a diagram of the processor block of FIG. 1C.

FIG. 2 is a detailed functional block diagram of processor block 101. Processor block 101 includes two DSP cores 200a and 200b, labeled DSPA and DSPB respectively. Cores 200a and 200b operate in conjunction with respective dedicated program RAM 201a and 201b, program ROM 202a and 202b, and data RAM 203a and 203b. Shared data RAM 204, which the DSPs 200*a* and 200*b* can both access, provides for the exchange of data, such as PCM data and processing coefficients, between processors 200*a* and 200*b*. Processor block 101 also contains a RAM repair unit 205 that can repair a predetermined number of RAM locations within the on-chip RAM arrays to increase die yield.

DSP cores 200*a* and 200*b* respectively communicate with the peripherals through I/O Block 102 via their respective I/O buses 206*a*, 206*b*. The peripherals send interrupt and flag information back to the processor block via interrupt interfaces 207*a*, 207*b*.

Figure 3:
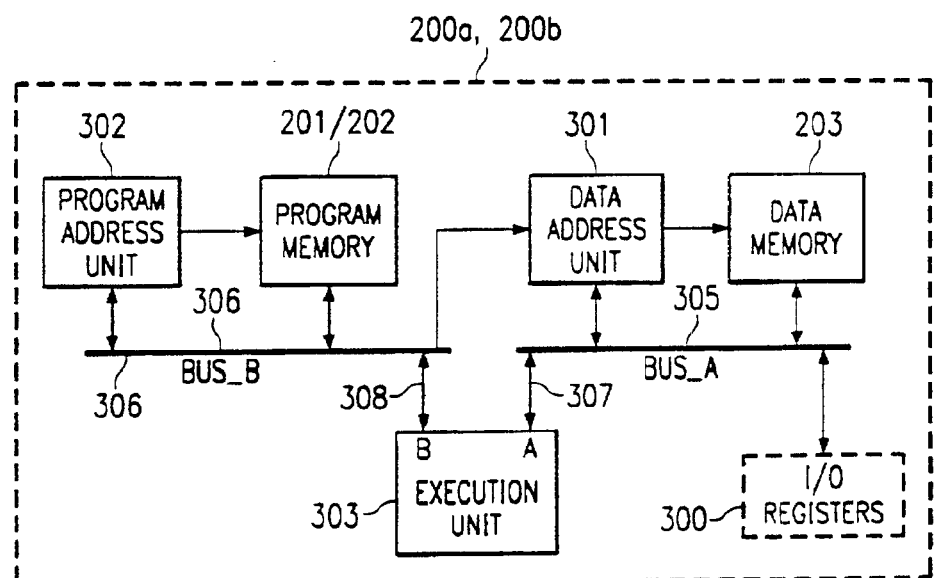
FIG. 3 is a diagram of the primary functional subblocks of the I/O block of FIG. 1C.

FIG. 3 is a detailed functional block diagram of I/O block 102. Generally, I/O block 102 contains peripherals for data input, data output, communications, and control. Input Data Unit 1300 accepts either compressed analog data or digital audio in any one of several input formats (from either the CDI or DAI ports). Serial/parallel host interface 1301 allows an external controller to communicate with decoder 100 through the HOST port. Data received at the host interface port 1301 can also be routed to input data unit 1300.

IPC (Inter-processor Communication) registers 1302 support a control-messaging protocol for communication between processing cores 200 over a relatively low-bandwidth communication channel. High-bandwidth data can be passed between cores 200 via shared memory 204 in processor block 101.

Clock manager 1303 is a programmable PLL/clock synthesizer that generates common audio clock rates from any selected one of a number of common input clock rates through the CLKIN port. Clock manager 1303 includes an STC counter which generates time information used by processor block 101 for managing playback and synchronization tasks. Clock manager 1303 also includes a programmable timer to generate periodic interrupts to processor block 101.

Debug circuitry 1304 is provided to assist in applications development and system debug using an external DEBUGGER and the DEBUG port, as well as providing a mechanism to monitor system functions during device operation.

A Digital Audio Output port 1305 provides multichannel digital audio output in selected standard digital audio formats. A Digital Audio Transmitter 1306 provides digital audio output in formats compatible with S/PDIF or AES/EBU.

In general, I/O registers are visible on both I/O buses, allowing access by either DSPA (200*a*) or DSPB (200*b*). Any read or write conflicts are resolved by treating DSPB as the master and ignoring DSPA.

The principles of the present invention further allow for methods of controlling the tone levels of decompressed audio data, as well as for methods and software for operating decoder 100. These principles will be discussed in further detail below. Initially, a brief discussion of the theory of operation of decoder 100 will be undertaken.

In a dual-processor environment like decoder 100, it is important to partition the software application optimally between the two processors 200*a*, 200*b* to maximize processor usage and minimize inter-processor communication. For this, the dependencies and scheduling of the tasks of each processor must be analyzed. The algorithm must be partitioned such that one processor does not unduly wait for the other and later be forced to catch up with pending tasks. For example, in most audio decompression tasks including Dolby AC-3®, the algorithm being executed consists of 2 major stages: 1) parsing the input bitstream with specified/computed bit allocation and generating frequency-domain transform coefficients for each channel; and 2) performing the inverse transform to generate time-domain PCM samples for each channel. Based on this and the hardware resources available in each processor, and accounting for other housekeeping tasks the algorithm can be suitably partitioned.

Usually, the software application will explicitly specify the desired output precision, dynamic range and distortion requirements. Apart from the intrinsic limitation of the compression algorithm itself, in an audio decompression task the inverse transform (reconstruction filter bank) is the stage which determines the precision of the output. Due to the finite-length of the registers in the DSP, each stage of processing (multiply+accumulate) will introduce noise due to elimination of the lesser significant bits. Adding features such as rounding and wider intermediate storage registers can alleviate the situation.

For example, Dolby AC-3® requires 20-bit resolution PCM output which corresponds to 120 dB of dynamic range. The decoder uses a 24-bit DSP which incorporates rounding, saturation and 48-bit accumulators in order to achieve the desired 20-bit precision. In addition, analog performance should at least preserve 95 dB S/N and have a frequency response of +/−0.5 dB from 3 Hz to 20 kHz.

Based on application and design requirements, a complex real-time system, such as audio decoder 100, is usually partitioned into hardware, firmware and software. The hardware functionality described above is implemented such that it can be programmed by software to implement different applications. The firmware is the fixed portion of software portion including the boot loader, other fixed function code and ROM tables. Since such a system can be programmed, it is advantageously flexible and has less hardware risk due to simpler hardware demands.

There are several benefits to the dual core (DSP) approach according to the principles of the present invention. DSP cores 200A and 200B can work in parallel, executing different portions of an algorithm and increasing the available processing bandwidth by almost 100%. Efficiency improvement depends on the application itself. The important thing in the software management is correct scheduling, so that the DSP engines 200A and 200B are not waiting for each other. The best utilization of all system resources can be achieved if the application is of such a nature that can be distributed to execute in parallel on two engines. Fortunately, most of the audio compression algorithms fall into this category, since they involve a transform coding followed by fairly complex bit allocation routine at the encoder. On the decoder side the inverse is done. Firstly, the bit allocation is recovered and the inverse transform is performed. This naturally leads into a very nice split of the decompression algorithm. The first DSP core (DSPA) works on parsing the input bitstream, recovering all data fields, computing bit allocation and passing the frequency domain transform coefficients to the second DSP (DSPB), which completes the task by performing the inverse transform (IFFT or IDCT depending on the algorithm). While the second DSP is finishing the transform for a channel n, the first DSP is working on the channel n+1, making the processing parallel and pipelined. The tasks are overlapping in time and as long as tasks are of similar complexity, there will be no waiting on either DSP side. Once the transform for each channel is completed, DSPB can postprocess this PCM data according to the desired. algorithm, which could include digital tone control.

Decoder 100, as discussed above, includes shared memory of 544 words as well as communication "mailbox"

Figure 4:
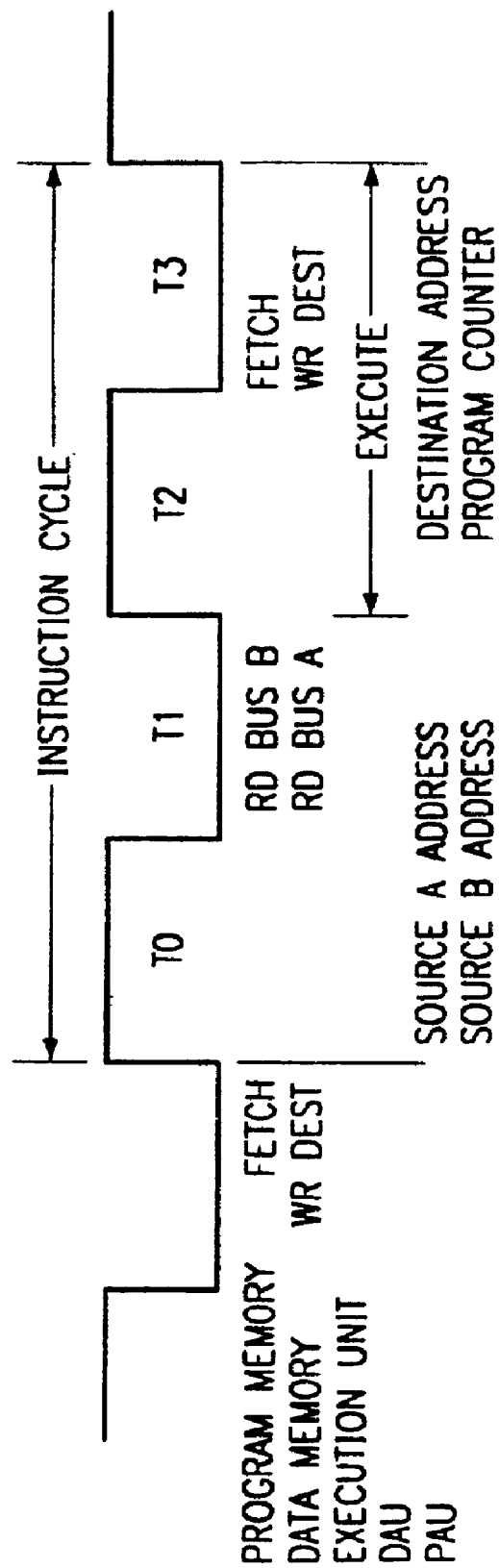
FIG. 4 is a diagram of the interprocessor communications (IPC) registers as shown in FIG. 3.

(IPC block 1302) consisting of 10 I/O registers (5 for each direction of communication). FIG. 4 is a diagram representing the shared memory space and IPC registers (1302).

One set of communication registers looks like this (a) AB_command_register (DSPA write/read, DSPB read only)

(b) AB_parameter1_register (DSPA write/read, DSPB read only)

(c) AB_parameter2_register (DSPA write/read, DSPB read only)

(d) AB_message_semaphores (DSPA write/read, DSPB write/read as well)

(e) AB_shared_memory_semaphores (DSPA write/read, DSP B read only) where AB denotes the registers for communication from DSPA to DSPB. Similarly, the BA set of registers are used in the same manner, with simply DSPB being primarily the controlling processor.

Shared memory 204 is used as a high throughput channel, while communication registers serve as low bandwidth channel, as well as semaphore variables for protecting the shared resources.

Both DSPA and DSPA 200a, 200b can write to or read from shared memory 204. However, software management provides that the two DSPs never write to or read from shared memory in the same clock cycle. It is possible, however, that one DSP writes and the other reads from shared memory at the same time, given a two-phase clock in the DSP core. This way several virtual channels of communications could be created through shared memory. For example, one virtual channel is transfer of frequency domain coefficients of AC-3 stream and another virtual channel is transfer of PCM data independently of AC-3. While DSPA is putting the PCM data into shared memory, DSPB might be reading the AC-3 data at the same time. In this case both virtual channels have their own semaphore variables which reside in the AB_shared_memory_semaphores registers and also different physical portions of shared memory are dedicated to the two data channels. AB_command_register is connected to the interrupt logic so that any write access to that register by DSPA results in an interrupt being generated on the DSP B, if enabled. In general, I/O registers are designed to be written by one DSP and read by another. The only exception is AB_message_sempahore register which can be written by both DSPs. Full symmetry in communication is provided even though for most applications the data flow is from DSPA to DSP B. However, messages usually flow in either direction, another set of 5 registers are provided as shown in FIG. 4 with BA prefix, for communication from DSPB to DSPA.

The AB_message_sempahore register is very important since it synchronizes the message communication. For example, if DSPA wants to send the message to DSPB, first it must check that the mailbox is empty, meaning that the previous message was taken, by reading a bit from this register which controls the access to the mailbox. It the bit is cleared, DSPA can proceed with writing the message and setting this bit to 1, indicating a new state, transmit mailbox full. DSPB may either poll this bit or receive an interrupt (if enabled on the DSPB side), to find out that new message has arrived. Once it processes the new message, it clears the flag in the register, indicating to DSPA that its transmit mailbox has been emptied. If DSPA had another message to send before the mailbox was cleared it would have put in the transmit queue, whose depth depends on how much message traffic exists in the system. During this time DSPA would be reading the mailbox full flag. After DSPB has cleared the flag (set it to zero), DSPA can proceed with the next message, and after putting the message in the mailbox it will set the flag to I. Obviously, in this case both DSPs have to have both write and read access to the same physical register. However, they will never write at the same time, since DSPA is reading flag until it is zero and setting it to 1, while DSPB is reading the flag (if in polling mode) until it is 1 and writing a zero into it.

These two processes a staggered in time through software discipline and management.

When it comes to shared memory a similar concept is adopted. Here the AB_shared_memory_semaphore register is used. Once DSPA computes the transform coefficients but before it puts them into shared memory, it must check that the previous set of coefficients, for the previous channel has been taken by the DSPB. While DSPA is polling the semaphore bit which is in AB_shared_memory_semaphore register it may receive a message from DSPB, via interrupt, that the coefficients are taken. In this case DSPA resets the semaphore bit in the register in its interrupt handler. This way DSPA has an exclusive write access to the AB_shared_memory_semaphore register, while DSPB can only read from it. In case of AC-3, DSPB is polling for the availability of data in shared memory in its main loop, because the dynamics of the decode process is data driven. In other words there is no need to interrupt DSPB with the message that the data is ready, since at that point DSPB may not be able to take it anyway, since it is busy finishing the previous channel. Once DSPB is ready to take the next channel it will ask for it. Basically, data cannot be pushed to DSPB, it must be pulled from the shared memory by DSPB.

The exclusive write access to the AB_shared_memory_semaphore register by DSPA is all that more important if there is another virtual channel (PCM data) implemented. In this case, DSPA might be putting the PCM data into shared memory while DSPB is taking AC-3 data from it. So, if DSPB was to set the flag to zero, for the AC-3 channel, and DSPA was to set PCM flag to 1 there would be an access collision and system failure will result. For this reason, DSPB is simply sending message that it took the data from shared memory and DSPA is setting shared memory flags to zero in its interrupt handler. This way full synchronization is achieved and no access violations performed.

For a complete description of exemplary decoder 100 and its advantages, reference is now made to coassigned U.S. Pat. No. 6,081,783 entitled "DIGITAL AUDIO DECODING CIRCUITRY, METHODS AND SYSTEMS" granted Jun. 27, 2000 and incorporated herein by reference.

According to the inventive concepts, a tone control filter is provided for each of a selected number of frequency bands. In this case however, the filter coefficients are set at system initialization, or some other point, like a muted state, at which noise in the output is not critical, and then held constant during normal operation of the decoder. This insures that the filters are stable and match the appropriate initial conditions. The amplitude for the given frequency band is then scaled to achieve the desired audio response. The filters can be implemented in any one of a number of ways, including as Infinite Impulse Response (IIR) or Finite Impulse Response (FIR) filters. These filters can be first order, IIR or symmetric linear phase FIR which reduces the effects of phase distortion.

Figure 5:
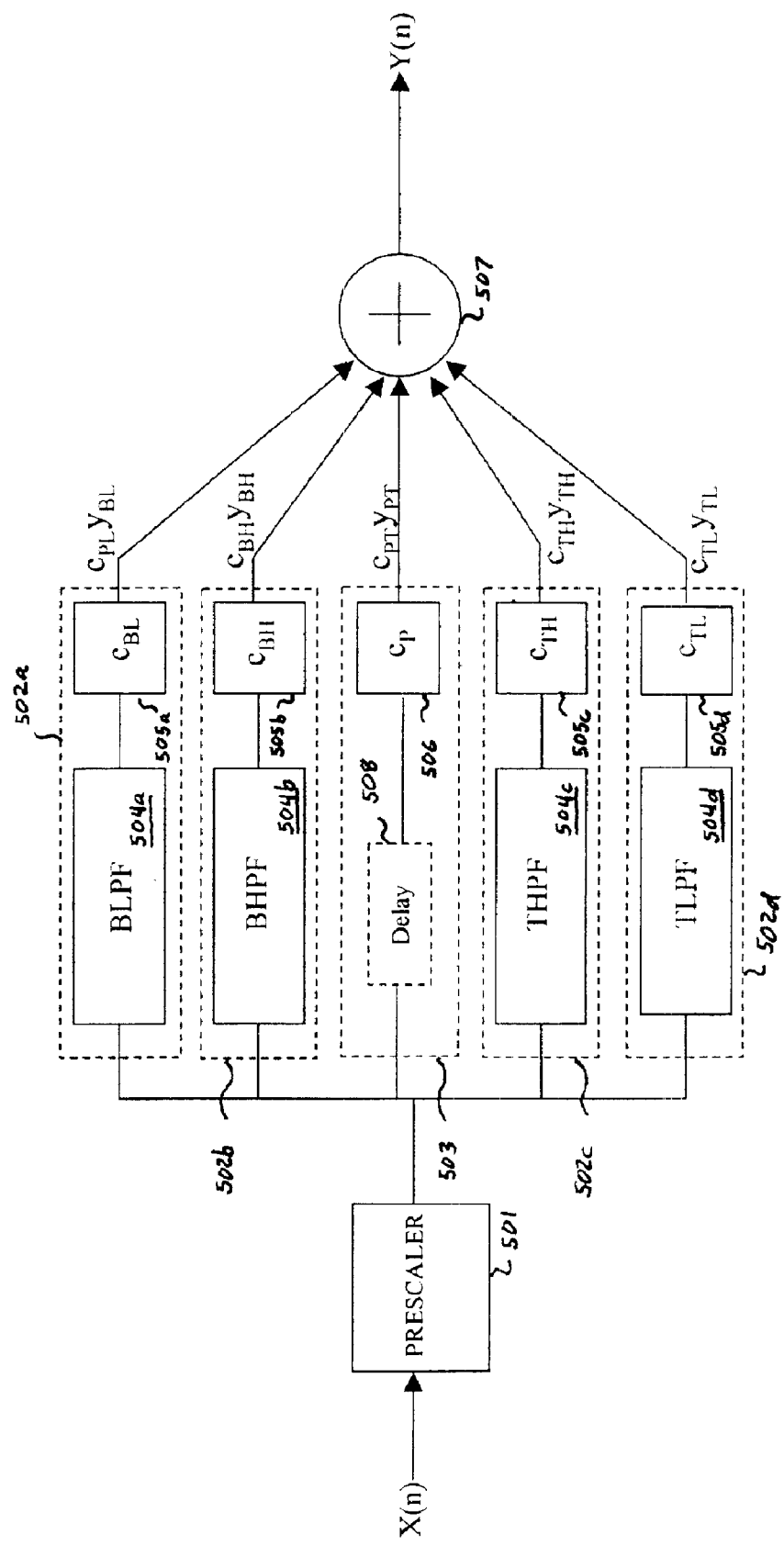
FIG. 5 is a functional block diagram of a preferred implementation of tone controls according to the inventive principles.

FIG. 5 is a functional block diagram of audio tone controls 500 according to the inventive concepts. Tone controls 500 in the illustrated embodiment are implemented in software running on DSPs 201, although discrete and integrated circuits can also be used. In the preferred embodiment, the tone controls are implemented by code being executed by DSPB on time domain (PCM) data extracted from the incoming data stream whether that incoming data stream is compressed, uncompressed, and/or in accordance with an AC97, MPEG, S/PDIF, or similar audio protocol. One set of tone controls 500 are provided for each audio channel. Two sets of tone controls 500 are implemented for two-channel stereo (L, R) processing, five sets (L,R,C, Ls, Rs) for AC-3/MPG, DTS and THX.

The digitized data stream X(n) for the given channel is first passed through a prescaler 501, which sets the overall headroom of Y(n). The amplitude of the signal output from the prescaler will be referred to in the discussion as the reference level, against which gains and/or boosts in the frequency bands are measured. Preattenuation provides headroom in cases where the user selects boost in a given band or bands. For example, if the pre-attenuation is set to −30 dB, then a boost of up to 30 dB in the bass or treble response is permitted.

The output from prescaler 501 passes through a set of parallel filter-attenuation paths 502a,d associated with the bass and treble frequency bands, and a pass-though path 503 associated with the center frequency band. In the illustrated embodiment, filter-attenuation path 502a includes a Bass Low Pass Filter (BLPF) 504a and a multiplier stage 505a scaling the corresponding filtered bass low frequency component $Y_{BL}$ by a factor (coefficient) of $C_{BL}$. A second bass filter-attenuation path 502b includes a Bass High Pass Filter (BHPF) 504b and a multiplier stage 505b scaling the corresponding filtered bass high frequency component $Y_{BH}$ by a factor of $C_{BH}$.

In the illustrated embodiment, center frequency band is not filtered and is instead directly passed through a multiplier stage 506, which scales the center frequency band component by a coefficient $C_{PT}$. Note, however, that if filters 502 are finite impulse response (FIR) filters, a delay line/phase compensator stage 5087 having half the number to taps as the FIR filters is included in this "pass through" path.

In the illustrated embodiment, two filter-attenuation paths 502c and 502d are provided for controlling the treble response. In particular, filter-attenuation path 502c includes a Treble High Pass Filter (THPF) 504c and a multiplier stage 505c scaling the corresponding filtered treble high frequency component $Y_{TH}$ by a factor of $C_{TH}$. Similarly, path 502d includes a Treble Low Pass Filter (THPF) 504d and a multiplier stage 505d scaling the corresponding filtered treble high frequency component $Y_{TL}$ by a factor of $C_{TL}$.

The tone processed signal Y(n) is then generated by a five-input summer 506 from the scaled frequency components from the filter-attenuator paths 502 and the direct pass-through path 503, as discussed further below.

Figure 6:
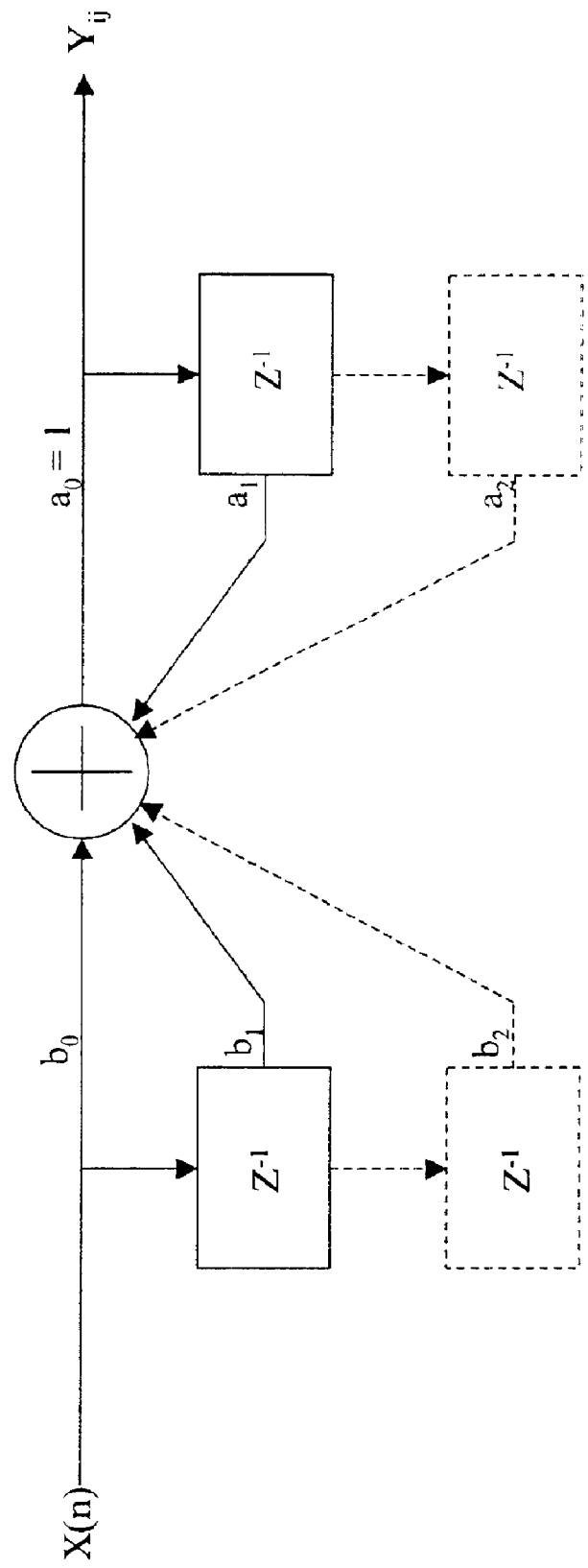
FIG. 6 is a functional block diagram of an infinite impulse response (IIR) filter suitable for use in the tone controls of FIG. 5.

There are a number of different ways to implement digital bass and treble filters 504a,d, including Infinite Impulse Response (IIR) and Finite Impulse Response (FIR) filters. An exemplary IIR embodiment is shown in FIG. 6.

IIR filter 600 is a biquad design, although other types of direct-form, cascade-form, lattice and lattice-ladder designs can also be used. In the preferred embodiment, filter 600 is a $1^{st}$ order software filter including a summer (adder) 601, a single delay stage 602 in the forward path and a single delay stage 603 in the feedback path such that:

$$Y(n)=b_0X(n)+b_1X(n-1)+a_1Y(n-1)$$

Wherein $a_i$ and $b_j$ are scaling coefficients, n is the sample number, and the initial conditions are $b_1X(n-1)=a_1Y(n-1)=0$. First order filters have several advantages including requiring fewer instructions for execution, and correspondingly less program and co-efficient memory. First order filters are generally stable and produce minimal phase-distortion.

However, it should be noted, that if some phase-induced distortion can be tolerated, and instruction overhead and memory are available, higher order filters can also be used. Higher order filters generally provide sharper roll-off at the passband edge. For reference, the additional delay elements for a second order IIR filter are shown in dashed lines in FIG. 6. (The response for the second order embodiment is $Y(n)=b_0X(n)+b_1X(n-1)+b_2(n-2)+a_1Y(n-1)+a_2Y(n-2)$).

The nominal (default) values for a set of preferred first order IIR filters for implementing tone controls 500 are given in Table 1:

| Filter | $B_0$ | $B_1$ | $A_1$ | Corner for Fs = 48 kHz |
|---|---|---|---|---|
| BLP | 0.005856037 | $b_0$ | 0.98828707 | 90 Hz |
| BHP | 0.977601647 | $-b_0$ | 0.955203295 | 350 Hz |
| TLP | 0.111110926 | $b_0$ | 0.777778149 | 1900 Hz |
| THP | 0.651673317 | $-b_0$ | 0.303346634 | 7500 Hz |

FIG. 7A shows approximate gain versus frequency responses for each filter for this set of coefficients.

Figure 7B:
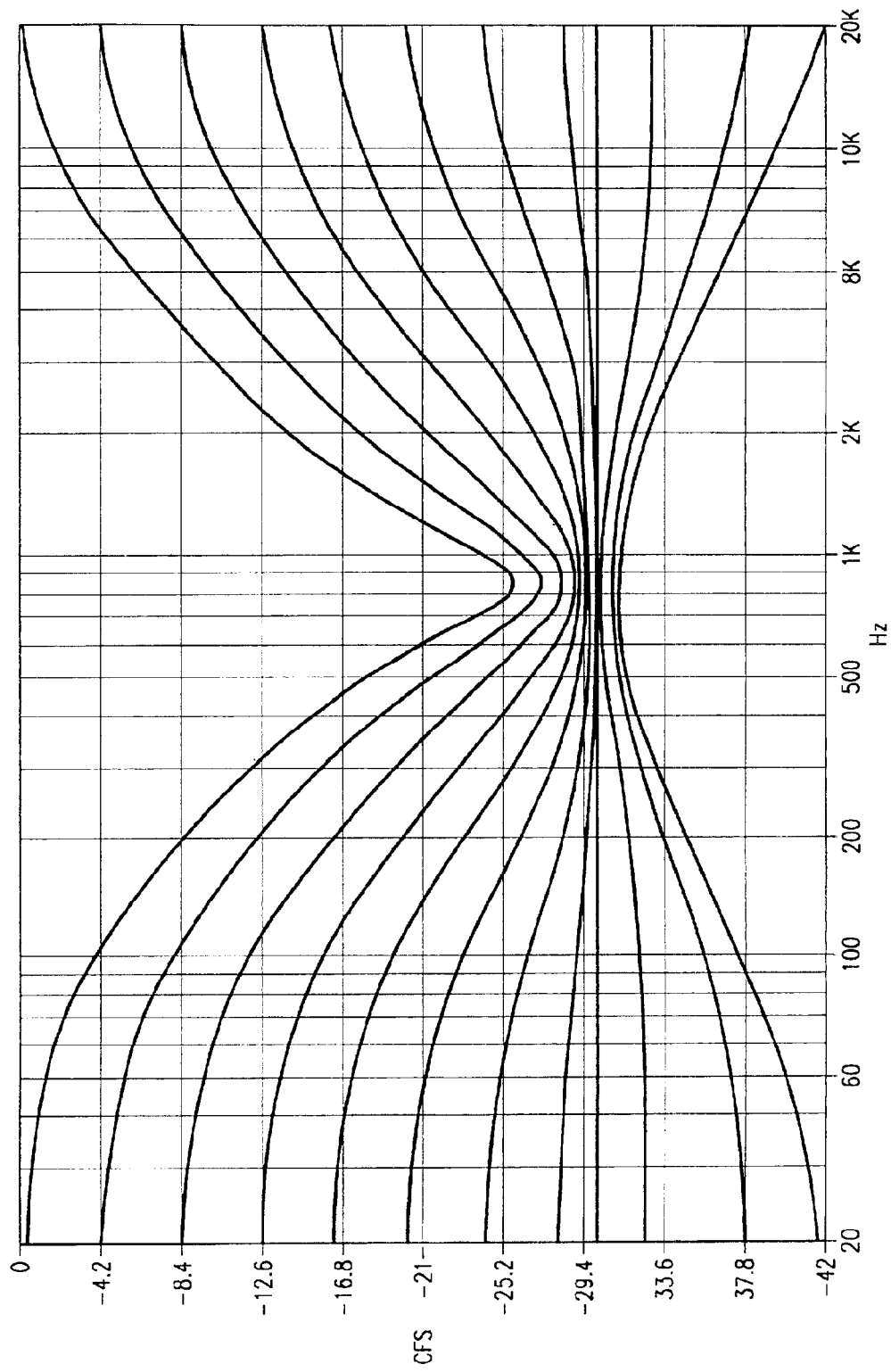
FIG. 7B is a gain versus frequency chart illustrating the response of the tone controls of FIGS. 5 and 7 following application of selected levels of attenuation in selected frequency bands.

FIG. 7B shows exemplary gain versus frequency curves for the embodiment based on the filter coefficient of Table 1 following the application of scaling through scaling stages 505a,b. The coefficients for the corresponding scaling stages 505a,d are selected in accordance with one of five possible operating regions set forth in Table 2:

| Bass (dB) | Treble (dB) | $C_{PT}$ | $C_{BL}$ | $C_{BH}$ | $C_{TL}$ | $C_{TH}$ |
|---|---|---|---|---|---|---|
| ≥0 | ≥0 | 1.0 | LUT1 (BL) | 0 | 0 | LUT1 (TL) |
| ≥0 | 0< | LUT0 (|TL|) | LUT1 (BL) | 0 | LUT2 (|TL|) | 0 |
| 0< | ≥0 | LUT0 (|BL|) | 0 | LUT2 (|BL|) | 0 | LUT1 (TL) |
| 0< | 0< | Eq. (1) | −CF | LUT2 (|BL|) | LUT2 (|TL|) | −CF | where:

LUTx(i) refers to the entry from lookup table (x) at index (i);

BL is the selected bass level;

|BL| is the absolute value of the selected bass level;

TL is the selected treble level;

|TL| is the absolute value of the selected treble level;

CF is a constant=0.1199; and

Eq. (1)=LUT0(|BL|)−LUT2(|TL|)−CF

Tables 3–5 illustrate the preferred populations for lookup tables LUT0–LUT2, respectively. Generally, the values in the lookup tables are calculated as follows:

LUT0: $2^{(n/6.02)}$ where $0 \geq n \geq -30$

LUT1: $2^{(n/6.02)}-1$ where $0 \leq n \leq 30$

LUT2: $1-2^{(n/6.02)}$ where $0 \geq n \geq -30$

TABLE 2

Look Up Table 0; "LUT0"

| dB | Real value | Hex value in 6.18 |
|---|---|---|
| 0 | 1 | 40000 |
| 1 | 0.891240713 | 390A1 |
| 2 | 0.794310008 | 32D60 |
| 3 | 0.707921418 | 2D4E9 |
| 4 | 0.630928389 | 28612 |
| 5 | 0.562309067 | 23FCE |
| 6 | 0.501152734 | 2012E |
| 7 | 0.44664772 | 1C95E |
| 8 | 0.398070632 | 197A0 |
| 9 | 0.354776754 | 16B4B |
| 10 | 0.316191487 | 143C8 |
| 11 | 0.281802726 | 12091 |
| 12 | 0.251154063 | 1012F |
| 13 | 0.223838726 | E536 |
| 14 | 0.199494186 | CC48 |
| 15 | 0.17779734 | B611 |
| 16 | 0.158460228 | A243 |
| 17 | 0.141226207 | 909E |
| 18 | 0.125866545 | 80E3 |
| 19 | 0.11217739 | 72DF |
| 20 | 0.099977057 | 6660 |
| 21 | 0.089103623 | 5B3E |
| 22 | 0.079412777 | 5152 |
| 23 | 0.0707759 | 4879 |
| 24 | 0.063078363 | 4098 |
| 25 | 0.056218005 | 3991 |
| 26 | 0.050103775 | 334E |
| 27 | 0.044654524 | 2DBA |
| 28 | 0.03979793 | 28C1 |
| 29 | 0.035469536 | 2452 |
| 30 | 0.031611894 | 205F |

TABLE 3

Look Up Table 1; "LUT1"

| dB | Real value | Hex value in 6.18 |
|---|---|---|
| 0 | 0 | 0 |
| 1 | 0.122031327 | 7CF6 |
| 2 | 0.258954299 | 1092B |
| 3 | 0.412586164 | 1A67D |
| 4 | 0.584965928 | 25701 |
| 5 | 0.778381424 | 31D10 |
| 6 | 0.99539967 | 3FB4A |
| 7 | 1.23890094 | 4F4A2 |
| 8 | 1.512116993 | 60C68 |
| 9 | 1.818673965 | 74652 |
| 10 | 2.16264049 | 8A68B |
| 11 | 2.548581706 | A31BF |
| 12 | 2.981619842 | BED2E |
| 13 | 3.467502196 | DDEB9 |
| 14 | 4.012677419 | 100CFB |
| 15 | 4.624381098 | 127F5E |
| 16 | 5.310731789 | 153E30 |
| 17 | 6.080838765 | 1852C7 |
| 18 | 6.944922918 | 1BC79A |
| 19 | 7.914452407 | 1FA866 |
| 20 | 9.002294867 | 24025A |
| 21 | 10.22288819 | 28E43D |
| 22 | 11.59243213 | 2E5EA7 |
| 23 | 13.12910333 | 348434 |
| 24 | 14.85329657 | 3B69C7 |
| 25 | 16,78789539 | 4326CE |
| 26 | 18,95857587 | 4BD595 |
| 27 | 21,39414738 | 55939B |
| 28 | 24.12693491 | 6081FB |
| 29 | 27.19320813 | 6CC5D8 |
| 30 | 30.63366274 | 7A88DF |

TABLE 4

Look Up Table 2; "LUT2"

| dB | Real value | Hex value in 6.18 |
|---|---|---|
| 0 | 0 | 0 |
| 1 | 0.108759287 | 6F5F |
| 2 | 0.205689992 | D2A0 |
| 3 | 0.292078582 | 12B17 |
| 4 | 0.369071611 | 179EE |
| 5 | 0.437690933 | 1C032 |
| 6 | 0.498847266 | 1FED2 |
| 7 | 0.55335228 | 236A2 |
| 8 | 0.601929368 | 26860 |
| 9 | 0.645223246 | 294B5 |
| 10 | 0.683808513 | 2BC38 |
| 11 | 0.718197274 | 2DF6F |
| 12 | 0.748845937 | 2FED1 |
| 13 | 0.776161274 | 31ACA |
| 14 | 0.800505814 | 333B8 |
| 15 | 0.82220266 | 349EF |
| 16 | 0.841539772 | 35DBD |
| 17 | 0.858773793 | 36F62 |
| 18 | 0.874133455 | 37F1D |
| 19 | 0.88782261 | 38D21 |
| 20 | 0.900022943 | 399A0 |
| 21 | 0.910896377 | 3A4C2 |
| 22 | 0.920587223 | 3AEAE |
| 23 | 0.9292241 | 3B787 |
| 24 | 0.936921637 | 3BF68 |
| 25 | 0.943781995 | 3C66F |
| 26 | 0.949896225 | 3CCB2 |
| 27 | 0.955345476 | 3D246 |
| 28 | 0.96020207 | 3D73F |
| 29 | 0.964530464 | 3DBAE |
| 30 | 0.968388106 | 3DFA1 |

The following examples illustrate operation of the preferred embodiments of tone controls 500. Here, gain scaling calculations are performed using linear rather than logarithmic values. The reference level Ref is the level after prescaling of each band, and Therefore boosts and cuts are taken relative thereto. The corresponding approximate responses are shown in FIGS. 8A–8D.

Case I Bass and Treble boosted by=+12 dB $C_{PT}=1.00$ $C_{BL}=2.9816$ $C_{BH}=0$ $C_{TL}=0$ $C_{TH}=2.9816$ $$Y(n)=1.00y_{PT}+2.9816y_{BL}+2.9816y_{TH}$$

Here, the pass through contribution results in a center band response of approximately $1.00y_{PT}$ or 0 dB, the low pass response is approximately $1.00y_{PT}+2.9816y_{BL}$ or $+12_{dB}$ and the high pass response is approximately $1.00y_{PT}+2.9816y_{TH}$ or +12 dB.

Case II Bass boosted by +6 dB and Treble cut by −8 dB $c_{PT}=0.3981$ $c_{BL}=0.9954$ $c_{BH}=0$ $c_{TL}=0.6019$ $c_{TH}=0$ $$Y(n)=0.398y_{PT}+0.9954y_{BL}+0.6019y_{TL}$$

In this case, the pass through contribution establishes a −8 dB baseband across the entire frequency range, the low frequency response is therefore approximately $0.3981y_{PT}+$ $0.9954y_{BL}$ or +6 dB, the response in the center of the band is approximately $0.3981y_{PT}+0.6019y_{TL}$ or 0 dB and the high frequency band is approximately the pass-through (baseline) level of −8 dB.

Case III Bass cut by −6 dB and Treble boosted by +12 dB $c_{PT}=0.5011$ $c_{BL}=0$ $c_{BH}=0.4988$ $c_{TL}=0$ $c_{TH}=2.9816$ $Y(n)=0.5011y_{PT}+0.4988y_{BH}+2.9816y_{TH}$ For Case III, the approximate gain versus frequency responses are as follows. For the low frequency band, the response is $0.5011y_{PT}$ or −6 dB, for the center band $0.5011y_{PT}+0.49884y_{BH}$ or 0 dB, and the high frequency response $0.5011y_{PT}+0.4988y_{BH}+2.9816y_{TH}$ or +12 db.

Case IV Bass cut by −6 dB and Treble cut by −6 dB $c_{PT}=0.12$ $c_{BL}=-0.12$ $c_{BH}=0.4988$ $c_{TL}=0.4988$ $c_{TH}=-0.12$.

In Case IV, the low frequency cut of −6 dB is approximately $0.12y_{PT}+0.4988y_{BH}-0.12y_{BL}$, the center band response is approximately $0.12y_{PT}+0.4988y_{BH}+0.4988Y_{TL}$ or 0 dB and the high frequency cut of −6 dB is approximately $0.12y_{PT}+0.4988y_{TL}-0.12y_{TH}$.

Although as few as two filters can be used (one for bass and one for treble), the four filter embodiment described above advantageously allows for the treble and bass responses to be adjusted nearly symmetrically. However, for finer frequency response resolution, additional filters and scalers can be used.

Notwithstanding the number of filters and scalers used, the principles of the present invention are relatively straightforward to apply advantageously in either hardware or software embodiments. First order IIR filters for example require only an adder and two delay stages for feedback. Scaler operations can be implemented with multipliers. For the software embodiments, the number of filter coefficients is reduced and only a three input mixer is required.

Deleted Text.

In the preferred first order IIR embodiment, 0.8 MIPs are required per channel, along with 130 words of program memory, 5 words of coefficient memory for level coefficient storage and 8 words of coefficient memory for filter coefficients. The memory and MIPs will proportionally change as greater or fewer filter-scaler paths are used.

The tradeoff between the sharper roll-off provided by higher order IIR filters and the resulting phase distortion may not be acceptable, depending on the application. If roll-off of greater than 6 dB per octave is required, then preferably symmetric FIR filters are used. Moreover, the frequency response curves at higher boost and cut levels will generally be better than those of IIR filters.

Figure 9:
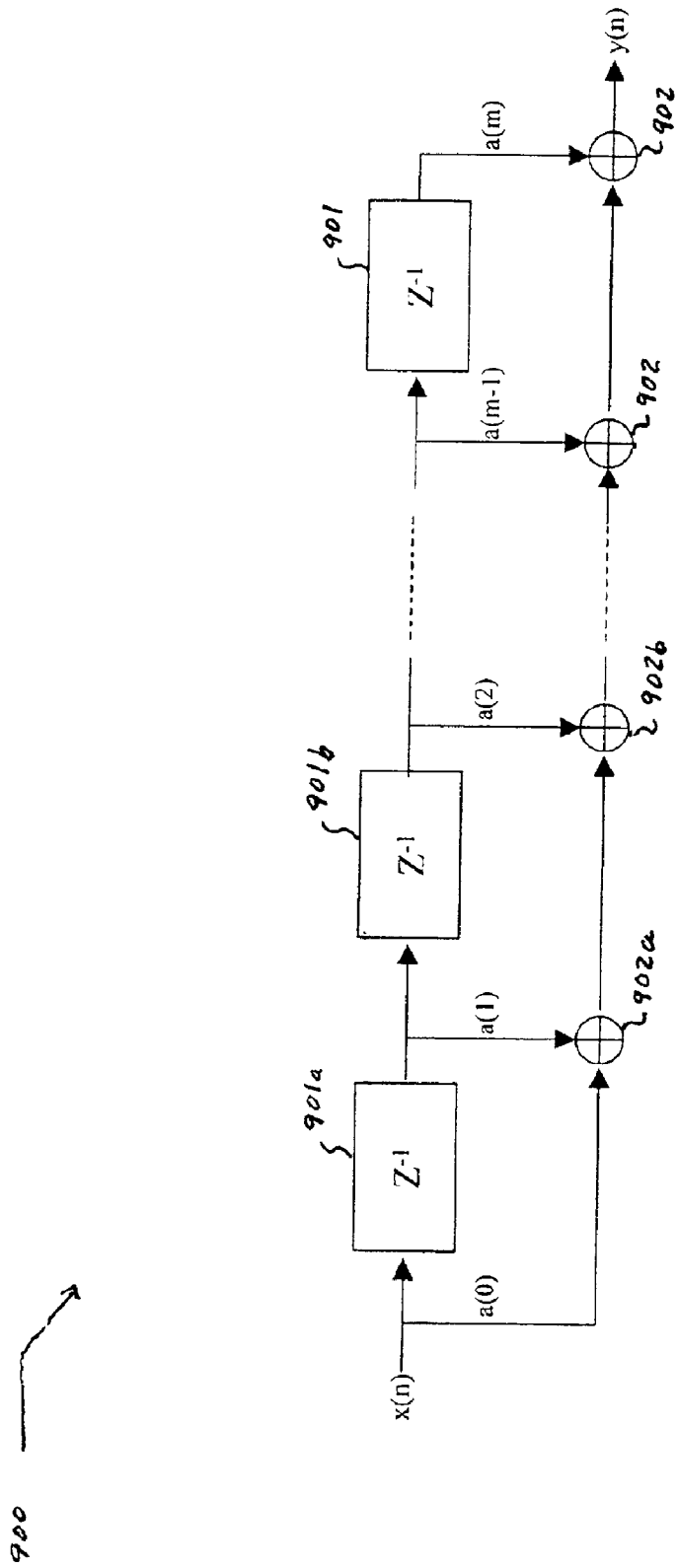
FIG. 9 is a block diagram of an exemplary FIR filter suitable for use in alternate embodiments of the invention.

Any one of a number of symmetric FIR filter designs can be used, including direct, lattice and cascade filter forms. For reference, an exemplary direct form FIR filter is shown in FIG. 9. The equation for this type of filter is:

$$y(n) = \sum_{k=1}^{m} A(k)n(n \cdot k)$$

where k=0, . . . m−1, M is the number of stages or taps, and n is the sample number.

To achieve a 6 dB nominal roll-off at the passband edges, a FIR filter of between 12 and 15 taps is preferably used.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. Digital tone controls comprising:
    a first path including a digital filter and a scaler for controlling a level of a low frequency component of a received digital audio signal;
    a second path including a digital filter and a scaler for controlling a level of a high frequency component of the received digital audio signal;
    a third path including a scaler for controlling a level of an unfiltered component of the received audio signal; and
    a summer for adding a contribution from each of the paths to generate a composite signal having a selected gain-frequency response.

2. The digital tone controls of claim 1 wherein the digital filters comprise infinite impulse response filters.

3. The digital tone controls of claim 1 wherein the digital filters comprise finite impulse response filters.

4. The digital tone controls of claim 1 wherein the filters and scalers are implemented in software.

5. The digital tone controls of claim 1 wherein the filters and scales are implemented in software executed on a digital signal processor.

6. The digital tone controls of claim 1 wherein the digital filters are first order filters.

7. The digital tone controls of claim 1 wherein the scalers multiply the filter output by a positive coefficient.

8. A method of controlling tonal level in a digital audio data stream comprising the steps of:
    filtering the audio data stream with a plurality of digital filler to extract a plurality of frequency components of a selected set of frequency bands;
    selectively scaling each of the frequency components;
    scaling an unfiltered component of the digital audio data stream; and
    summing the scaled frequency components with the scaled digital audio data stream to generate a digital signal having a selected frequency response.

9. The method of claim 8 wherein said step of filtering comprises the substeps of:
    filtering the audio date stream with a bass low pass filter passing frequencies below a first corner frequency;

filtering the audio data stream with a treble low pass filter passing frequencies below a second corner frequency, the second corner frequency being higher in frequency than the first corner frequency;

filtering the audio data stream with a bass high pass filter passing frequencies above a third corner frequency; and filtering the audio data stream with a treble high pass filter passing frequencies above a fourth corner frequency, the fourth corner frequency being higher in frequency than the third corner frequency.

10. The method of claim 8 wherein said step of filtering comprises the step of filtering the audio data stream using software filters.

11. The method of claim 8 wherein said step of filtering comprises the step of filtering the audio data stream with a first order digital filter.

12. The method of claim 8 wherein said step of filtering comprises the step of extracting each frequency component with an infinite Impulse response filter.

13. The method of claim 8 wherein said step of filtering comprises the step of extracting each frequency component with a finite impulse response fitter.

14. The method of claim 13 wherein the finite impulse response filter is of a $2^{nd}$ order or greater.

15. The method of claim 13 wherein the scalers take on positive values only.

16. An audio processing device comprising:
a port for receiving a stream of audio date; and
a digital signal processor operable to:
filter out and scale a low frequency component of a data stream extracted from said received stream of audio data;
filter out and scale a high frequency component of the extracted data stream;
scale an unfiltered component of me extracted data stream; and
add the scaled low and high frequency components and the scaled unfiltered component of the extracted data stream to generate a composite signal having a selected gain-frequency response.

17. The audio processing device of claim 16 wherein said digital signal processor comprises a selected one of a plurality of digital signal processors forming an audio decoder.

18. The audio processing device of claim 16 wherein said digital signal processor is operable to execute program code implementing infinite impulse filters for filtering out said low and high frequency components of said extracted data stream.

19. The audio processing device of claim 16 wherein said digital signal processor is operable to execute program code implementing finite impulse response filters for filtering out said low and high frequency components of said extracted data stream.

20. The audio processing device of claim 16 wherein said digital signal processor is operable to execute program code implementing multipliers for scaling said components of said extracted data stream.

21. The audio processing device of claim 16 wherein said received audio data stream comprises a compressed audio data stream and said extracted date stream extracted from said received data stream comprises a stream of PCM data.

22. The audio processing device of claim 16 wherein said received audio data stream comprises an uncompressed data stream and said extracted date stream comprises a stream of PCM data.

23. A program for implementing tone controls in a programmable audio processing device comprising:
a plurality of digital filters having programmable coefficients for extracting a plurality of frequency components form a digital audio data stream;
a plurality of programmable scalers each for selectively setting an amplitude of one of the frequency components output from a corresponding digital filter;
a programmable scaler for selectively setting an amplitude of an unfiltered component of the digital data stream to generate a scaled unfiltered component;
a summer for summing a plurality of scaled frequency components output from the programmable scalers and the scaled unfiltered component.

24. The program of claim 23 wherein the coefficients are selected to extract at least one bass component and at least one treble component from the audio data stream.

25. The program of claim 23 wherein the coefficients are selected to provide a plurality of filters including:
a bass low pass filter extracting frequencies below a selected bass frequency;
a bass high pass filter for extracting frequencies above a selected bass frequency;
a treble low pass filter for extracting frequencies below a selected treble frequency; and
a treble high pass filter for extracting frequencies above a selected treble frequency.

26. The program of claim 23 wherein the digital filters are first order.

27. The program of claim 23 wherein the digital filters are second order or higher.

28. The program of claim 23 wherein the digital filters are IIR filters.

29. The program of claim 23 wherein the digital filters are FIR filters.

* * * * *